US008744090B2

(12) United States Patent
Akino

(10) Patent No.: US 8,744,090 B2
(45) Date of Patent: Jun. 3, 2014

(54) RIBBON MICROPHONE

(75) Inventor: Hiroshi Akino, Machida (JP)

(73) Assignee: Kabushiki Kaisha Audio-Technica, Machida-shi (JP)

( * ) Notice: Subject to any disclaimer, the term of this patent is extended or adjusted under 35 U.S.C. 154(b) by 201 days.

(21) Appl. No.: 13/435,758

(22) Filed: Mar. 30, 2012

(65) Prior Publication Data

US 2012/0269366 A1 Oct. 25, 2012

(30) Foreign Application Priority Data

Apr. 20, 2011 (JP) ................................ 2011-094154

(51) Int. Cl.
*H03G 11/00* (2006.01)
*H04R 3/00* (2006.01)
*H02B 1/00* (2006.01)

(52) U.S. Cl.
USPC .............. 381/55; 381/111; 381/113; 381/123

(58) Field of Classification Search
USPC ........... 381/55, 111, 113, 115, 122, 123, 173, 381/176, 189, 399
See application file for complete search history.

(56) References Cited

FOREIGN PATENT DOCUMENTS

JP 2009-218685 9/2009

*Primary Examiner* — Matthew Eason
(74) *Attorney, Agent, or Firm* — Manabu Kanesaka

(57) ABSTRACT

To suppress the transverse displacement of a ribbon due to an impact to a level smaller than that achieved by electromagnetic damping. The switch 150 breaks a path between the piezoelectric element 140 and the secondary winding 132 so as to be non-conductive when a power plug is connected (the microphone is in use), and completes a path between the piezoelectric element 140 and the secondary winding 132 so as to be conductive when a power plug is not connected (the microphone is not in use), in order to generate a driving force in the direction opposite to the displacement direction of the ribbon 10 by causing a current corresponding to power generated in the piezoelectric element 140 to flow in the ribbon 10.

5 Claims, 3 Drawing Sheets

RIBBON MICROPHONE

CROSS-REFERENCE TO RELATED APPLICATION

The present application is based on, and claims priority from, Japanese Application Serial Number JP2011-094154, filed Apr. 20, 2011, the disclosure of which is hereby incorporated by reference herein in its entirety.

TECHNICAL FIELD

The present invention relates to a ribbon microphone having a metallic ribbon foil used for a diaphragm, and in particular to a technique for protecting the diaphragm against shocks or the like.

BACKGROUND ART

As shown in FIG. 3, such a ribbon microphone is provided with an acoustic-electric converter (i.e. microphone unit) 1. The converter 1 has a metallic foil such as an aluminum foil in the form of a strip of several micrometers thick as a diaphragm 10. The foil is placed in a parallel magnetic field formed by a pair of permanent magnets 30, 30 facing each other with a predetermined space therebetween.

Attachment electrodes 20, 20, which include a pair of support electrode plates 20*a* and 20*b*, are attached to opposite ends 10*a* and 10*b* of the diaphragm 10. The attachment electrodes 20, 20 are connected to a step-up transformer (not shown) on the primary winding side of the transformer.

The step-up transformer is connected to a 3-pole (or 3-pin) output connector on the secondary winding side of the transformer. When the microphone is used, a power plug of a phantom power supply is connected to the output connector. The ribbon microphone is thus operable with the phantom power supply.

Since such a ribbon microphone is bi-directional and mass controlled, the resonance frequency can be significantly lowered and sounds can be collected in a lower tone range.

A problem with a ribbon microphone is that, on impact against the microphone, an inertial force of the diaphragm (sometimes referred to as "ribbon" hereinafter) 10 stretches the ribbon foil, leaving it in an elongated state by plastic deformation. When a ribbon plastic-deformed in this way contacts a magnetic pole or a nearby component, the performance may significantly be degraded.

For this reason, it is a common practice to provide protections against shocks during transportation such as cushioning materials attached to the inside and/or outside of a box containing a microphone so as to avoid a direct impact on the microphone.

Besides shocks during transportation, however, other shocks on impact against a microphone include a drop impact experienced, for example, when the microphone is accidentally dropped while being handled on a microphone stand for attachment. It is therefore necessary to protect a ribbon against shocks when the microphone is not in use (i.e. when the phantom power supply is not connected) during other times than transportation.

Thus, the applicant has proposed in Japanese Patent Application Publication No.2009-218685 to suppress vibrations of a ribbon by electromagnetic damping when the microphone is not in use.

In the arrangement according to Japanese Patent Application Publication No.2009-218685, there is provided a mechanical switch that turns on (i.e. closed), for example, when a power plug provided on an end of a cable (i.e. cable end plug) on the phantom power supply side is not plugged into an output connector of ribbon microphone and turns off (i.e. open) once the power plug is plugged. The switch is turned on and off across the ribbon.

In this way, when the power plug on the phantom power supply side is not plugged into the output connector and the microphone is not in use, the switch turns on to create an electrically short circuit across the ribbon, resulting in a closed circuit including the ribbon.

In this state, if the ribbon is moved within the parallel magnetic field (i.e. magnetic gap) on impact against the microphone, a back electromotive force is generated in the ribbon. The back electromotive force causes a current to flow through the closed circuit to generate an electromagnetic braking force. Since the braking force acts in the direction opposite to the direction of vibration of the ribbon, the vibrations of the ribbon due to an impact can be suppressed.

As described above, according to the invention set forth in Japanese Patent Application Publication No.2009-218685, when the power plug of the phantom power supply is not plugged into the output connector during transportation or while the microphone is being handled for installation, the movement of the ribbon is restricted by electromagnetic damping even upon impact against the microphone. Thus, the elongation, along with plastic deformation, of the ribbon can be prevented.

If a considerably strong impact force is applied, however, the transverse displacement of the ribbon may not be suppressed to a small level only by the electromagnetic damping.

An object of the invention, therefore, is to ensure that the transverse displacement of the ribbon due to an impact can be suppressed to a level smaller than that achieved by the electromagnetic damping.

SUMMARY OF THE INVENTION

To solve the above problem, the present invention is characterized by a ribbon microphone, comprising: an acoustic-electric converter including a pair of permanent magnets that form a parallel magnetic field and a diaphragm of metallic ribbon foil that is placed in the parallel magnetic field and vibrates in response to incoming sound waves; and a step-up transformer including a primary winding connected to the diaphragm and a secondary winding connected to an output connector, the output connector receiving a power plug of a phantom power supply when the microphone is in use, the step-up transformer increasing a voltage generated by the diaphragm to a predetermined voltage, the voltage then being output to the phantom power supply side through the output connector, wherein the ribbon microphone further comprising a piezoelectric element that generates electric power in response to an external impact on the acoustic-electric converter, one electrode of the piezoelectric element being connected to one lead of the secondary winding, another electrode of the piezoelectric element being connected to another lead of the secondary winding via a switching device, wherein the switching device breaks a path between said another electrode of the piezoelectric element and said another lead of the secondary winding so as to be non-conductive when the power plug is connected, and the switching device completes the path between said another electrode of the piezoelectric element and said another lead of the secondary winding so as to be conductive when the power plug is not connected.

In a preferable aspect of the invention, the most sensitive direction of the piezoelectric element is oriented in parallel with the sound-collecting axis of the diaphragm.

Furthermore, it is preferred that the piezoelectric element is integrally attached to a frame supporting the acoustic-electric converter. Still further, a multilayer ceramic piezoelectric element is preferably used as the piezoelectric element.

In a preferable aspect, the switching device is switchable depending on whether or not the power plug is connected to the output connector, and the switching device includes a movable contact that is provided on a connector base of the output connector and that is moved by the power plug.

According to the invention, when the power plug of the phantom power supply is not connected and the microphone is not in use, the switching device connects both the electrodes of the piezoelectric element to the secondary winding of the step-up transformer. In this state, when an external impact causes the piezoelectric element to generate electric power, a current flows through the step-up transformer to the ribbon connected to the primary winding of the transformer so as to generate a driving force in the direction opposite to the direction in which the ribbon can be inertially displaced. In this way, the displacement of the ribbon can be suppressed within a range smaller than that achieved by the electromagnetic damping.

DETAILED DESCRIPTION

An embodiment of the invention will now be described with reference to FIGS. 1A, 1B and 2, although the present invention is not limited to the embodiment.

Figure 1A:
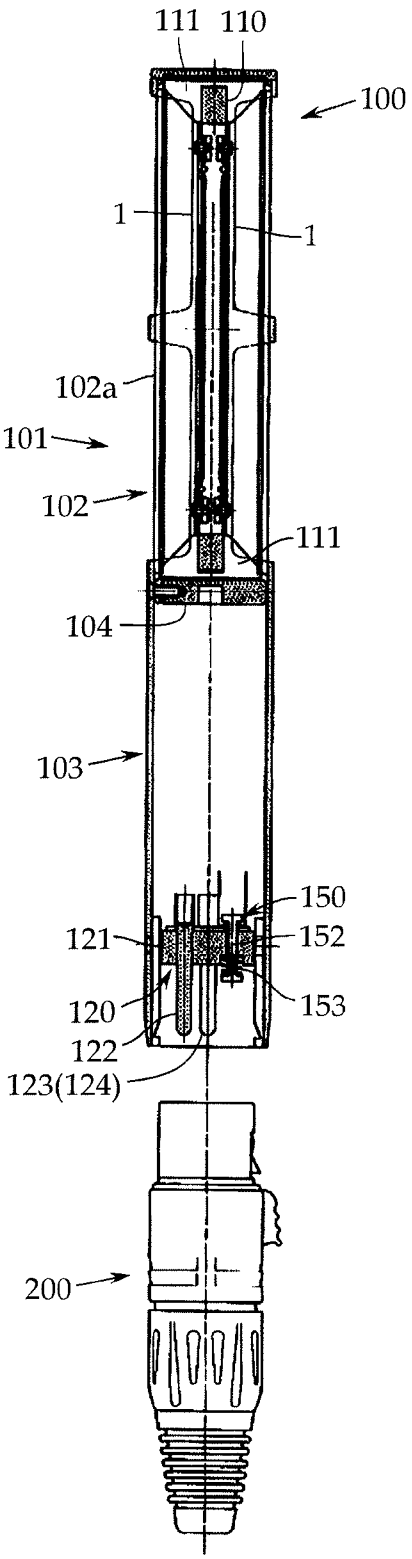
FIG. 1A is a sectional view illustrating a ribbon microphone according to an embodiment of the invention, in which a power plug is not connected to the output connector of the microphone.
Figure 1B:
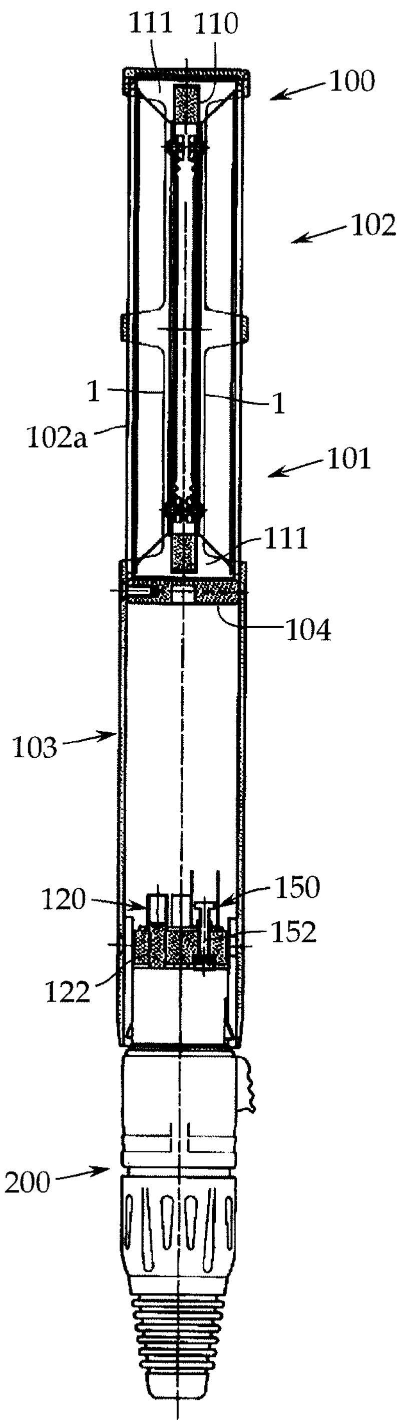
FIG. 1B is a sectional view illustrating a ribbon microphone according to the embodiment of the invention, in which a power plug is connected to the output connector of the microphone.

As shown in FIGS. 1A and 1B, a ribbon microphone 100 according to the embodiment is provided with a pair of acoustic-electric converters (i.e. microphone units) 1 having a ribbon foil, or a strip of foil, consisting of a metallic foil used as a diaphragm. The microphone is also provided with, as a casing, a cylindrical microphone case 101 made up of a sound-collecting section 102 and a case body 103 connected to each other via a connecting plate 104.

Figure 3:
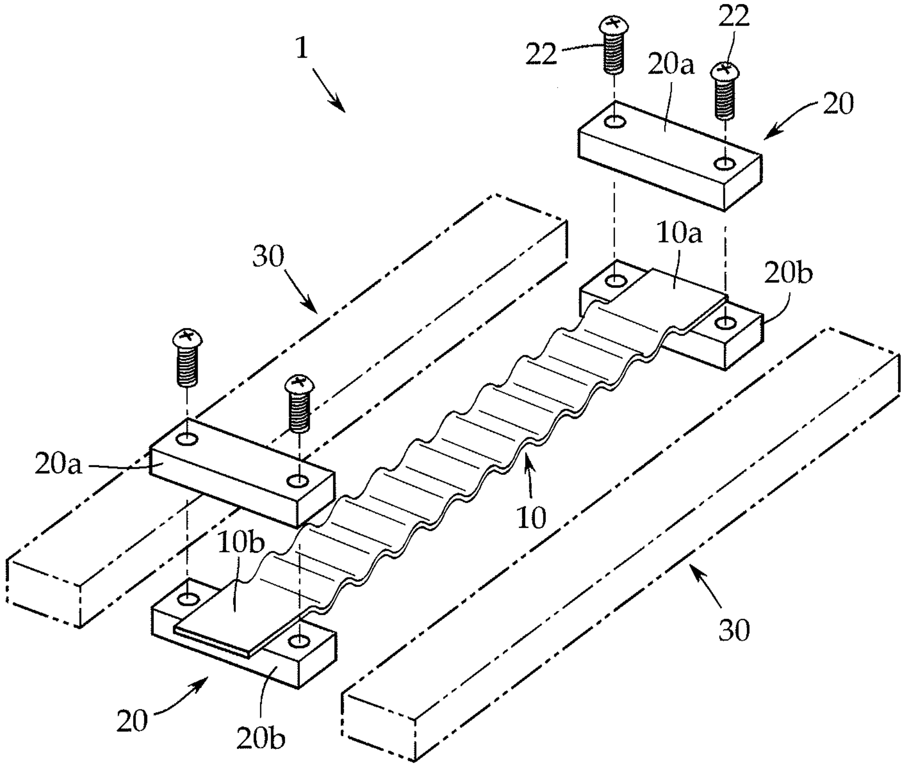
FIG. 3 RELATED ART
FIG. 3 is a perspective view showing a basic configuration of the ribbon microphone.

With reference to FIG. 3, the acoustic-electric converters 1 may each have a metallic foil such as an aluminum foil in the form of a strip of several micrometers thick as a diaphragm 10. The foil is placed in a parallel magnetic field formed by a pair of permanent magnets 30, 30 facing each other with a predetermined space therebetween.

In this embodiment, each acoustic-electric converter 1 is supported by a frame 110 of a rectangular shape surrounding the converter. Each acoustic-electric converter 1 is mounted in the sound-collecting section 102 of the microphone case 101 via the frame 110 and each of supporting brackets 111, 111 provided on opposite ends of the frame 110. The sound-collecting section 102 is provided with a guard mesh 102*a* consisting of a wire mesh for use as a windshield. Alternatively, only one acoustic-electric converter 1 may be used.

The ribbon microphone 100 is operated with a phantom power supply (not shown), and therefore includes an output connector 120 in the case body (microphone body) 103 of the microphone case 101. A power plug 200 of the phantom power supply is removably connected to the output connector 120.

The output connector 120 is a 3-pin connector specified in EIAJ RC-5236 "Latch Lock Type Round Connector for Audio Equipment" and has a first pin 122 for ground, a second pin 123 for signal hot, and a third pin 124 for signal cold within a connector base 121 made of synthetic resin. In FIG. 1A, since the second pin 123 and the third pin 124 are coincide with each other, only the second pin 123 is shown. The 3-pin connector may include a cannon XLR-3 connector.

Figure 2:
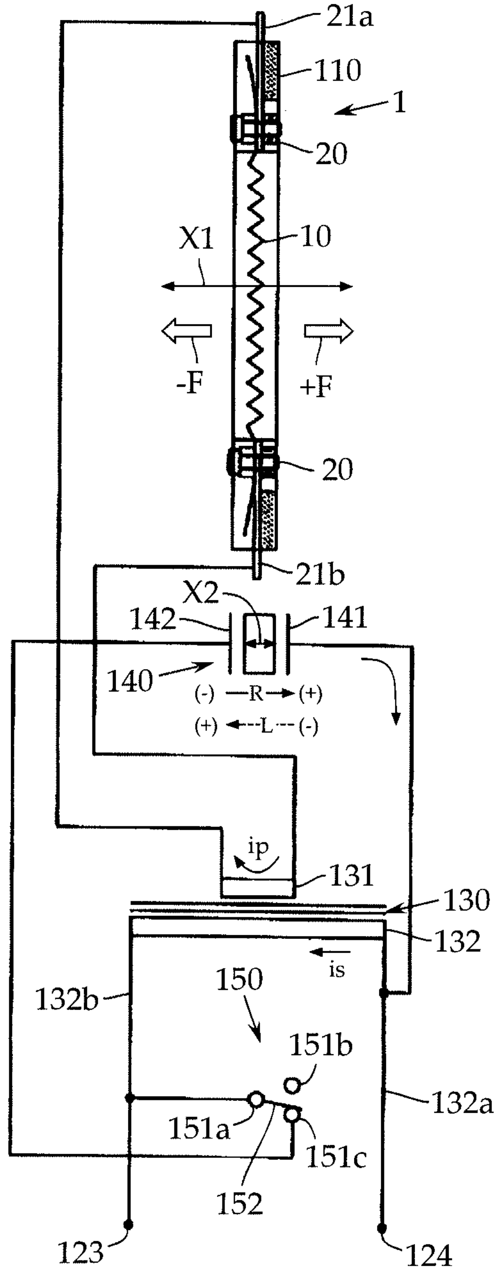
FIG. 2 is a diagram illustrating a primary configuration of the invention.

The case body 103 houses a step-up transformer 130 shown in FIG. 2. The diaphragm (ribbon) 10 is connected to the primary winding 131 of the step-up transformer 130 through a predetermined electric wiring.

In this embodiment, terminal strips 21*a* and 21*b* extend from attachment electrodes 20, 20 of the ribbon 10, and opposite ends of the primary winding 131 are connected to the terminal strips 21*a* and 21*b* through a predetermined electric wiring.

The secondary winding 132 of the step-up transformer 130 is connected between the second pin 123 and the third pin 124 of the output connector 120.

As shown in FIG. 2, the ribbon microphone 100 includes a piezoelectric element 140. A multilayer ceramic piezoelectric element is preferably used as the piezoelectric element 140. The piezoelectric element 140 is positioned to undergo an impact on the microphone case 101 along with the ribbon 10.

The location of the piezoelectric element may be on the connecting plate 104 or the supporting bracket 111 or on the inner wall surface of the case body 103, or most preferably, on the frame 110 directly supporting the acoustic-electric converter 1.

The piezoelectric element 140 has the most sensitive direction in which the amount of electric power generated in response to an accelerated impact applied thereto reaches the maximum. To mount the piezoelectric element 140 in the ribbon microphone 100, the most sensitive direction X2 is preferably in parallel (or coincides) with the sound-collecting axis X1 of the ribbon 10.

In this embodiment, one electrode 141 of the piezoelectric element 140 is connected to one lead 132*a* of the secondary winding 132, and the other electrode 142 is connected to the other lead 132*b* of the secondary winding 132 via a switch 150.

The switch 150 has three fixed contacts: a common contact 151*a* connected to the lead 132*b*, a neutral contact 151*b*, and an ON contact 151*c*, and has a movable contact 152 that connects selected one of the neutral contact 15 lb and the ON contact 151*c* to the common contact 151*a*. When the movable contact 152 selects the ON contact 151*c*, the other electrode 142 of the piezoelectric element 140 is connected to the other lead 132*b* of the secondary winding 132. Thus, the piezoelectric element 140 is connected to the secondary winding 132.

Although the switch 150 may be manually switchable, the movable contact 152 is switched by the power plug 200 being connected to or removed from the output connector 120.

In this case, the movable contact 152 is provided as a rod-shaped movable electrode slidably extending through the connector base 121, and as shown in FIG. 1A, the movable contact 152 is connected to the ON contact 151*c* side by a coil spring 153 when the power plug 200 is not connected to the output connector 120.

On the other hand, when the power plug 200 is connected to the output connector 120 as shown in FIG. 1B, the movable contact 152 is urged by the power plug 200 against the biasing force of the coil spring 153, and switched to the neutral contact 151*b* side, thereby disconnecting the piezoelectric element 140 from the secondary winding 132.

When the ribbon microphone 100 is subjected to an impact, such as a drop impact, while the power plug 200 is not connected to the output connector 120 as shown in FIG. 1A, the piezoelectric element 140 generates electric power, and the resultant current "is" flows through the secondary winding 132 of the step-up transformer 130, causing a current "ip" induced in the primary winding 131 to flow through the ribbon 10.

The current "ip" flowing through the ribbon 10 generates a driving force leftward or rightward in FIG. 2 in the ribbon 10 in accordance with Fleming's left-hand rule depending on the direction of the parallel magnetic field (the magnetic field orientation) formed by the permanent magnets 30, 30; in the piezoelectric element (multilayer ceramic piezoelectric element) 140, however, the polarities of the electrodes 141 and 142 are reversed depending on the direction of the impact (or the acceleration), and the flowing direction of the current "ip" is also reversed accordingly.

For example, assume that when an impact is applied from the left as indicated by a solid line arrow R in FIG. 2, a positive polarity appears on the electrode 141 side and a negative polarity on the electrode 142 side. When an impact is applied from the right as indicated by a dashed line arrow L in FIG. 2, a negative polarity appears on the electrode 141 side and a positive polarity on the electrode 142 side, reversing the flowing direction of the current "ip".

Assuming here that the direction in which the ribbon can be inertially displaced due to an impact is the direction +F (rightward) in FIG. 2, for example, the transverse displacement of the ribbon 10 can be reduced as much as possible by causing the current "ip" to flow through the ribbon 10 so as to generate a driving force in the direction −F (leftward) in the ribbon 10.

Since the direction of the parallel magnetic field is constant, knowledge on the relationship between the direction of an impact applied and the polarities appearing on the electrodes 141 and 142 of the piezoelectric element 140 may be acquired in advance, and based on the knowledge, the piezoelectric element 140 may be connected to the secondary winding 132 so that the current "ip" can flow in the direction in which a driving force is generated in the ribbon 10 in such a manner that the displacement of the ribbon 10 is suppressed.

According to the invention, in this way, the ribbon 10 is driven upon impact to the direction in which the ribbon 10 can withstand the impact. Even if a considerably strong impact force is applied, therefore, the transverse displacement of the ribbon 10 can be suppressed to a level smaller than that achieved by the electromagnetic damping as described in the background art.

Additionally, the movable contact 152 of the switch 150 can be switched automatically by the power plug 200 being connected to or removed from the output connector 120. This eliminates the inconvenient need of switching the switch 150.

Furthermore, when the power plug 200 is connected to the output connector 120 and the microphone is not in use, no noise or the like is generated by the piezoelectric element 140 because the piezoelectric element 140 is disconnected from the secondary winding 132 of the step-up transformer 130.

The invention claimed is:

1. A ribbon microphone, comprising:

an acoustic-electric converter including a pair of permanent magnets that form a parallel magnetic field and a diaphragm of metallic ribbon foil that is placed in the parallel magnetic field and vibrates in response to incoming sound waves; and a step-up transformer including a primary winding connected to the diaphragm and a secondary winding connected to an output connector, the output connector receiving a power plug of a phantom power supply when the microphone is in use, the step-up transformer increasing a voltage generated by the diaphragm to a predetermined voltage, the voltage then being output to the phantom power supply side through the output connector, wherein the ribbon microphone further comprising a piezoelectric element that generates electric power in response to an external impact on the acoustic-electric converter, one electrode of the piezoelectric element being connected to one lead of the secondary winding, another electrode of the piezoelectric element being connected to another lead of the secondary winding via a switching device, wherein the switching device breaks a path between said another electrode of the piezoelectric element and said another lead of the secondary winding so as to be non-conductive when the power plug is connected, and the switching device completes the path between said another electrode of the piezoelectric element and said another lead of the secondary winding so as to be conductive when the power plug is not connected.

2. The ribbon microphone according to claim 1, wherein a most sensitive direction of the piezoelectric element is oriented in parallel with a sound-collecting axis of the diaphragm.

3. The ribbon microphone according to claim 1, wherein the piezoelectric element is integrally attached to a frame supporting the acoustic-electric converter.

4. The ribbon microphone according to claim 1, wherein a multilayer ceramic piezoelectric element is used as the piezoelectric element.

5. The ribbon microphone according to claim 1, wherein the switching device is switchable depending on whether or not the power plug is connected to the output connector, and the switching device includes a movable contact that is provided on a connector base of the output connector and that is moved by the power plug.

* * * * *